(12) United States Patent
Miyaji et al.

(10) Patent No.: US 7,672,111 B2
(45) Date of Patent: Mar. 2, 2010

(54) ELECTROSTATIC CHUCK AND METHOD FOR MANUFACTURING SAME

(75) Inventors: Jun Miyaji, Fukuoka-ken (JP); Ikuo Itakura, Fukuoka-ken (JP); Shoichiro Himuro, Fukuoka-ken (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 11/998,463

(22) Filed: Nov. 29, 2007

(65) Prior Publication Data

US 2008/0212255 A1 Sep. 4, 2008

(51) Int. Cl.
*H02N 13/00* (2006.01)
*H02H 1/00* (2006.01)

(52) U.S. Cl. ...................................... 361/234
(58) Field of Classification Search .................. 361/234
See application file for complete search history.

(56) References Cited

U.S. PATENT DOCUMENTS

| | | | | |
|---|---|---|---|---|
| 7,352,555 B2 * | 4/2008 | Handa et al. | ................. | 361/234 |
| 7,468,880 B2 * | 12/2008 | Itakura et al. | ................ | 361/234 |

FOREIGN PATENT DOCUMENTS

| | | |
|---|---|---|
| JP | 60-96832 | 7/1985 |
| JP | 62-264638 | 11/1987 |
| JP | 63-283037 | 11/1988 |
| JP | 01-240243 | 9/1989 |
| JP | 04-133443 | 12/1992 |
| JP | 09-134951 | 5/1997 |
| JP | 09-148420 | 6/1997 |
| JP | 10-154745 | 6/1998 |
| JP | 10-223742 | 8/1998 |
| JP | 10-261697 | 9/1998 |
| JP | 11-233604 | 8/1999 |
| JP | 11-265930 | 9/1999 |
| JP | 2001-060619 | 3/2001 |
| JP | 2001-284328 | 10/2001 |
| JP | 2001-313331 | 11/2001 |
| JP | 2001-338970 | 12/2001 |
| JP | 2002-093896 | 3/2002 |
| JP | 2002-324834 | 11/2002 |
| JP | 2003-037158 | 2/2003 |

(Continued)

*Primary Examiner*—Ronald W Leja
(74) *Attorney, Agent, or Firm*—Carrier, Blackman & Associates, P.C.; Joseph P. Carrier; William D. Blackman

(57) ABSTRACT

An electrostatic chuck includes: a metal plate with an insulator film formed on a surface thereof by thermal spraying; and a dielectric substrate with an electrode formed on a surface thereof. The metal plate and the dielectric substrate are bonded together via an insulative adhesive interposed therebetween so that the insulator film is opposed to the electrode, and the insulator film has a thickness of 0.6 mm or less. Alternatively, An electrostatic chuck includes: a metal plate with an insulator film formed on a surface thereof by thermal spraying; and a dielectric substrate with an electrode selectively formed on a surface thereof. The metal plate and the dielectric substrate are bonded together via an insulative adhesive interposed therebetween so that the insulator film is opposed to the electrode. The insulative adhesive is interposed also between the insulator film and a portion of the surface of the dielectric substrate where the electrode is not formed, and the insulative adhesive has a thermal conductivity of 1 W/mK or more.

23 Claims, 4 Drawing Sheets

FOREIGN PATENT DOCUMENTS

| | | |
|---|---|---|
| JP | 2003-152065 | 5/2003 |
| JP | 2003-168725 | 6/2003 |
| JP | 2004-168609 | 6/2004 |
| JP | 2004-200462 | 7/2004 |
| JP | 2004-235563 | 8/2004 |
| JP | 2004-241668 | 8/2004 |
| JP | 2005-057234 | 3/2005 |
| JP | 2007-243139 | 9/2007 |
| JP | 2007243149 A * | 9/2007 |

* cited by examiner

ELECTROSTATIC CHUCK AND METHOD FOR MANUFACTURING SAME

CROSS-REFERENCE TO RELATED APPLICATIONS

This application is based upon the prior Japanese Patent Application No. 2006-256892, filed Sep. 22, 2006; the entire contents of which are incorporated herein by reference.

BACKGROUND OF THE INVENTION

1. Field of the Invention

This invention relates to an electrostatic chuck for attracting a semiconductor substrate or a glass substrate, and to a method for manufacturing the same.

2. Background Art

An electrostatic chuck is used as a means for attracting and holding a semiconductor substrate or a glass substrate in a vacuum processing chamber, which is subjected to processing heat of plasma for etching, CVD, sputtering, ion implantation, and ashing (JP-A 10-223742(Kokai) (1998), JP-A 2003-152065(Kokai), JP-A 4-133443(Kokai) (1992), JP-A 2001-338970(Kokai)).

FIG. 4 shows the structure of an electrostatic chuck of a comparative example disclosed in JP-A 10-223742(Kokai). A dielectric layer 103 holding electrodes 102 inside is integrally bonded onto a metal plate 100 via an organic adhesive 101 such as a silicone resin. With regard to the method for embedding the electrode 102 in the dielectric layer 103, the electrode (tungsten) is printed on the surface of a ceramic green sheet, which is to be a dielectric layer by sintering, and another ceramic green sheet is overlaid thereon, and sintered (hot press). JP-A 2003-152065(Kokai) also discloses a configuration of an electrostatic chuck generally identical to the foregoing with the average particle size of the ceramic being held down to 2 μm or less.

The electrostatic chuck of the type shown in FIG. 4 is not convenient to manufacture because the method for embedding the electrode 102 is complicated, prolonging the production time. More specifically, in order to embed the electrode inside the dielectric, two dielectric substrates are sintered and shaped, and then an electrode material is sandwiched therebetween and integrated by hot press processing such as heating and pressurizing. Thus a technically sophisticated and complicated process is needed.

In contrast to the above electrostatic chuck holding electrodes inside the dielectric, which involves a complicated process, electrostatic chucks manufactured by a simplified process are also proposed (JP-A 4-133443(Kokai), JP-A 2001-338970(Kokai)).

JP-A 4-133443(Kokai) discloses an electrostatic chuck in which an electrode formed on the surface of a dielectric substrate is oppositely fixed to a base plate made of an aluminum or other metal material via an adhesive.

JP-A 2001-338970(Kokai) discloses an electrostatic chuck in which an electrode is formed on the surface of a dielectric substrate, which is overlaid with an insulative resin such as polyimide and bonded to a metal base plate.

However, neither of the electrostatic chucks of JP-A 4-133443(Kokai) and JP-A 2001-338970(Kokai) can realize a structure of satisfying sufficient cooling performance while maintaining high insulation reliability.

The insulation reliability of the electrostatic chuck of JP-A 4-133443(Kokai) can indeed be enhanced if the insulative adhesive interposed between the electrode 2 and the base plate 3 is sufficiently thickened. However, silicone and other resins commonly used as an adhesive have poor thermal conductivity. In particular, the performance of cooling a wafer attracted to the surface of the dielectric substrate cannot be sufficiently ensured.

The electrostatic chuck of JP-A 2001-338970(Kokai) is based on an insulative resin such as polyimide, which has poor thermal conductivity. Hence, likewise, the performance of cooling a wafer cannot be sufficiently ensured.

SUMMARY OF THE INVENTION

According to an aspect of the invention, there is provided an electrostatic chuck including: a metal plate with an insulator film formed on a surface thereof by thermal spraying; and a dielectric substrate with an electrode formed on a surface thereof, the metal plate and the dielectric substrate being bonded together via an insulative adhesive interposed therebetween so that the insulator film is opposed to the electrode, and the insulator film having a thickness of 0.6 mm or less.

According to another aspect of the invention, there is provided an electrostatic chuck including: a metal plate with an insulator film formed on a surface thereof by thermal spraying; and a dielectric substrate with an electrode selectively formed on a surface thereof, the metal plate and the dielectric substrate being bonded together via an insulative adhesive interposed therebetween so that the insulator film is opposed to the electrode, the insulative adhesive being interposed also between the insulator film and a portion of the surface of the dielectric substrate where the electrode is not formed, and the insulative adhesive having a thermal conductivity of 1 W/mK or more.

According to still another aspect of the invention, there is provided a method for manufacturing an electrostatic chuck, including bonding a metal plate to a dielectric substrate via an insulative adhesive interposed therebetween, an insulator film being formed by thermal spraying on a surface the metal plate, an electrode being formed on a surface of the dielectric substrate, and the bonding being performed so that the insulator film is opposed to the electrode.

DETAILED DESCRIPTION OF THE INVENTION

An embodiment of the invention will now be described with reference to the accompanying drawings.

Figure 1:
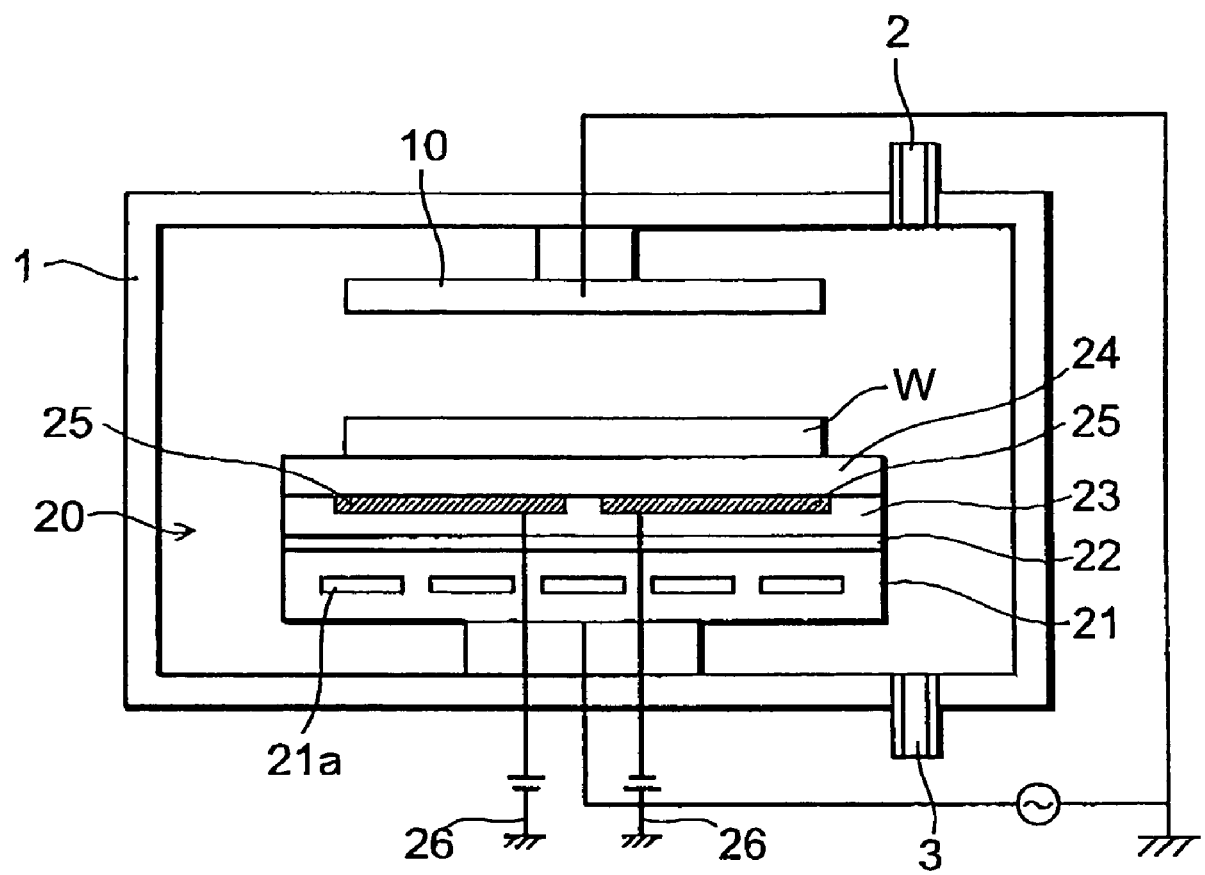
FIG. 1 is an overall view of a plasma processing apparatus including an electrostatic chuck according to an embodiment of the invention.
Figure 2:
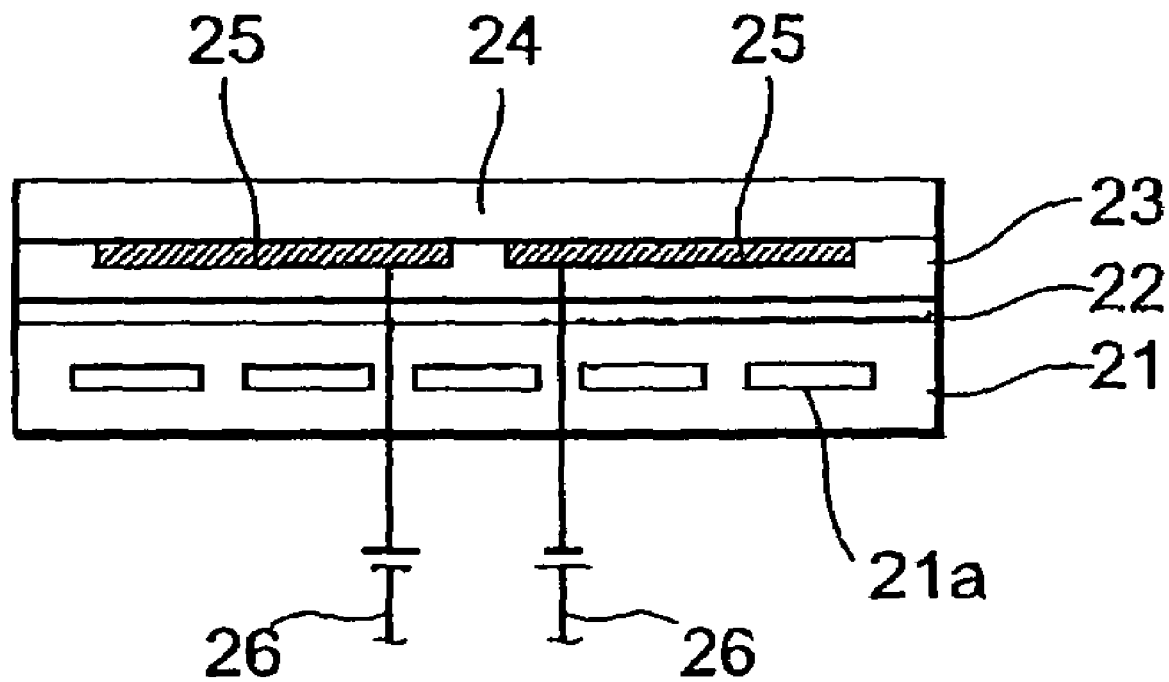
FIG. 2 is a cross-sectional view of the electrostatic chuck.
Figure 3:
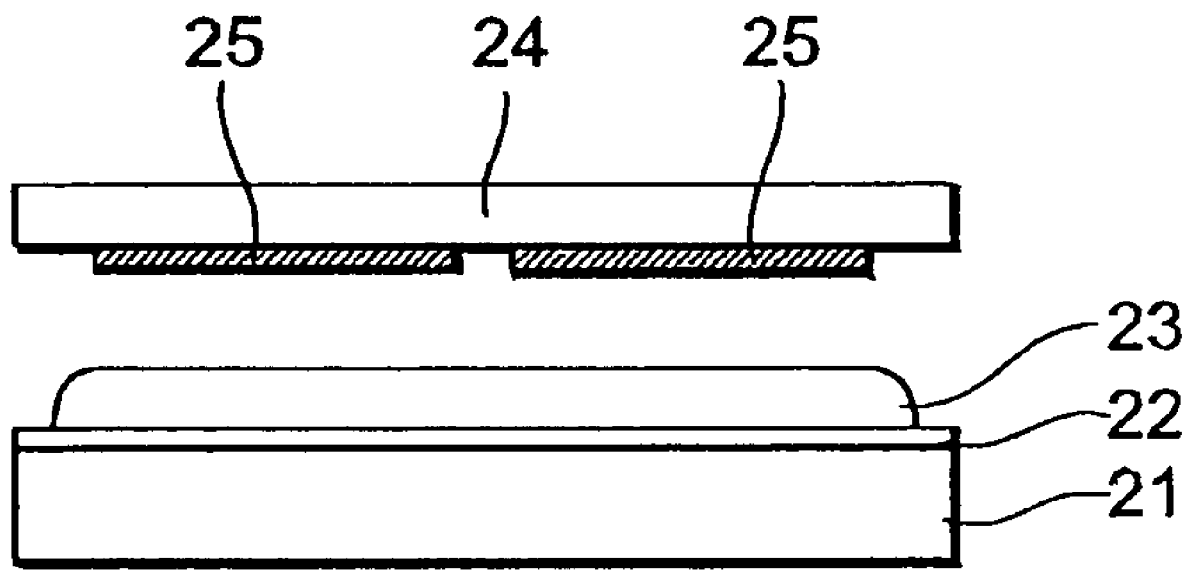
FIG. 3 illustrates a procedure of assembling the electrostatic chuck.
Figure 4:
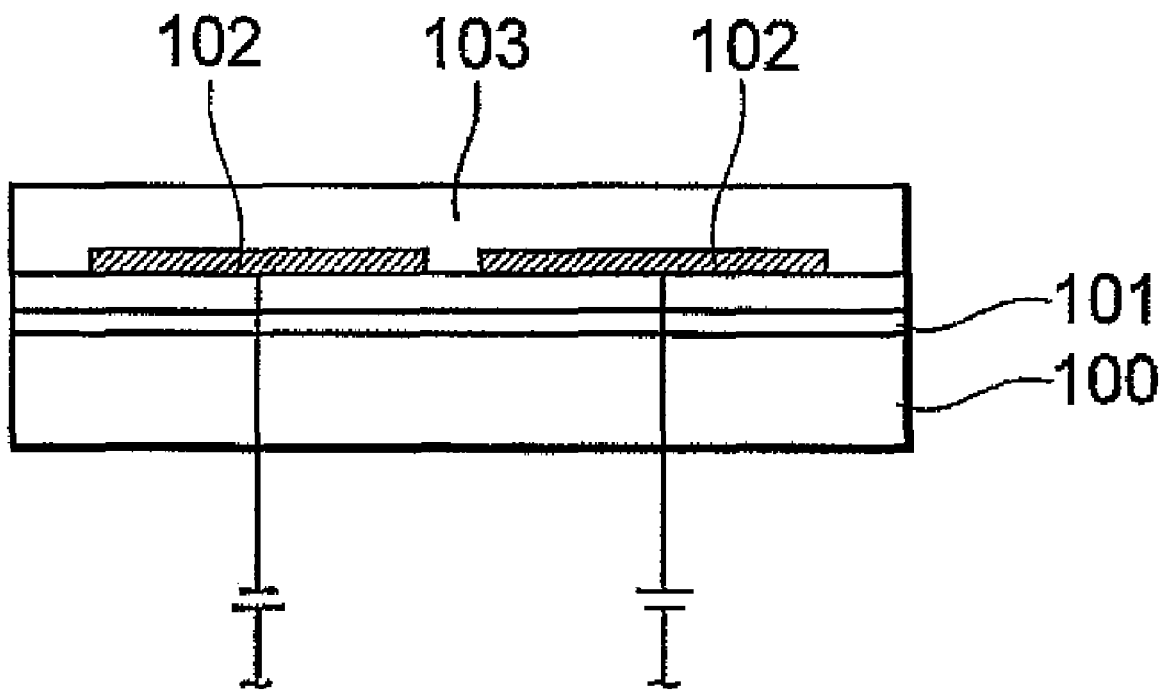
FIG. 4 is a cross-sectional view of an electrostatic chuck of a comparative example.

FIG. 1 is an overall view of a plasma processing apparatus including an electrostatic chuck according to the embodiment of the invention, FIG. 2 is a cross-sectional view of the electrostatic chuck, and FIG. 3 illustrates a procedure of assembling the electrostatic chuck.

The plasma processing apparatus includes an upper electrode 10 for plasma generation and an electrostatic chuck 20 in a chamber 1. The chamber 1 has an introduction port 2 for a reaction gas such as $CF_4$ and $O_2$ in its ceiling and an evacuation port 3 connected to a decompressing apparatus.

The basic configuration of the electrostatic chuck 20 is as follows. An insulator film 22 is formed on the surface of a metal plate 21 by thermal spraying. A dielectric substrate 24 is bonded onto the insulator film 22 via an insulative adhesive layer 23. The surface of the dielectric substrate 24 serves as a mounting surface for a workpiece W such as a semiconductor wafer to be attracted thereto, and electrodes 25, 25 are formed on the lower surface of the dielectric substrate 24. Leads 26, 26 for feeding the electrodes 25, 25 pass through the metal plate 21 and extend downward. The leads 26 are insulated from the metal plate 21.

The above electrostatic chuck 20 is assembled as follows. As shown in FIG. 3, a metal plate 21 with an insulator film 22 formed thereon in advance and a dielectric substrate 24 with electrodes 25 formed thereon are prepared, and bonded together via an insulative adhesive 23 so that the insulator film 22 of the metal plate 21 is opposed to the electrodes 25 of the dielectric substrate 24.

The metal plate 21 is made of a metal having good thermal conductivity such as an aluminum alloy or copper, and has a coolant channel 21*a* formed inside.

The insulator film 22 requires electrical insulation between the electrode and the metal plate and heat transference for transferring processing heat to the metal plate. The insulator film 22 is preferably made of a material having higher thermal conductivity than the insulative adhesive, and most preferably made of an inorganic material such as alumina ($Al_2O_3$) or other ceramics.

Such an insulator film made of a material having higher thermal conductivity than the insulative adhesive is formed with a thickness of 0.6 mm or less. Hence the heat transference is improved as compared with the insulative adhesive layer alone while insulation reliability is ensured. Thus the efficiency of cooling the wafer is improved. Furthermore, formation by thermal spraying allows the above insulator film to be formed without heat degradation of the plate and without use of unnecessary adhesives.

The thermal conductivity of the insulator film is preferably 2 W/mK or more. Then the thermal conductivity is sufficiently improved as compared with the insulative adhesive layer alone, and the efficiency of cooling the wafer is further improved.

The thickness of the insulator film is preferably made as small as possible for enhancing cooling efficiency, while it is preferably made as large as possible for ensuring sufficient insulation against the voltage applied for attracting a substrate. The thickness of the insulator film satisfying both of them is 0.3 mm or more and 0.6 mm or less.

The insulative adhesive layer 23 requires electrical insulation between the electrodes and between the electrode and the outside, heat transference for transferring processing heat to the cooling plate, and flexibility for alleviating shear stress due to the linear expansion coefficient difference between the dielectric substrate and the metal plate with the insulating film formed on the surface thereof by thermal spraying.

The thermal conductivity of the insulative adhesive layer 23 is preferably 1 W/mK or more, and more preferably 1.6 W/mK or more. An insulative adhesive having such thermal conductivity can be obtained by adding alumina or aluminum nitride as a filler to a silicone resin, for example.

The thickness of the insulative adhesive layer 23 is preferably made as small as possible for enhancing cooling efficiency, while it is preferably made as large as possible for preventing the insulative adhesive layer from being peeled by shear stress due to the linear expansion coefficient difference between the dielectric substrate and the metal plate with the insulating film formed on the surface thereof by thermal spraying. The thickness of the adhesive layer satisfying both of them is 0.1 mm or more and 0.3 mm or less.

The flexibility of the insulative adhesive layer 23 is preferably 30% or more in elongation percentage. With the flexibility of this percentage or more, it is possible to obtain adhesiveness sufficient for preventing the insulative adhesive layer 23 from being peeled by shear stress due to the linear expansion coefficient difference between the dielectric substrate and the metal plate with the insulating film formed thereon.

The material used for the dielectric substrate 24 is selected in accordance with various requirements for the electrostatic chuck. A sintered ceramic is preferably used in view of thermal conductivity and reliability of insulation withstand voltage.

The sintered ceramic may be any one of alumina, yttria, silicon carbide, and aluminum nitride.

The volume resistivity of the sintered ceramic may be $10^{14}$ Ωcm or more at the operating temperature (Coulomb type electrostatic chuck) or $10^8$ to $10^{11}$ Ωcm at the operating temperature (Johnsen-Rahbek type electrostatic chuck).

In the case of a Coulomb type electrostatic chuck, for use in a practical voltage range (±1000 V to ±5000 V, preferably ±2000 V to ±5000 V), the thickness of the dielectric substrate is preferably 0.5 mm or less for ensuring sufficient suction force. Furthermore, the thickness of the dielectric substrate that can be fabricated as a structure is preferably 0.2 mm or more (more preferably, 0.3 mm or more).

In the case of a Johnsen-Rahbek type electrostatic chuck, for use in a practical voltage range (±500 V to ±2000 V), the thickness of the dielectric substrate is preferably 1.5 mm or less. Furthermore, the thickness of the dielectric substrate that can be fabricated as a structure is preferably 0.2 mm or more (more preferably, 0.3 mm or more).

The particle constituting the dielectric substrate preferably has an average particle size of 2 μm or less for enhancing plasma resistance. With an average particle size of 2 μm or less, it is possible to provide an electrostatic chuck where the roughness of the suction surface of the dielectric substrate suffers less variation despite repeated waferless cleaning.

With regard to the electrode 25, the surfaces of the dielectric substrate 24 is ground, and then a conductive film of TiC or Ti is formed thereon by CVD or PVD. A predetermined electrode pattern can be obtained from the conductive film by sand blasting or etching.

If the electrode 25 is selectively formed into a predetermined electrode pattern, the insulative adhesive layer 23 is also provided to cover the surface of the electrode 25, the portion between the electrodes, and the portion of the surface of the dielectric substrate 24 where the electrodes are not formed.

Because TiC or Ti used for the electrode has a higher thermal conductivity than the insulative adhesive layer 23, thermal conductivity in the electrode 25 may be different from that in the portion between the electrodes and the portion of the surface of the dielectric substrate 24 where the electrodes are not formed. In order to avoid temperature nonuniformity in the substrate and to uniformly cool the wafer, the thickness of the electrode 25 is preferably less than 5 μm, and more preferably 1 μm or less.

The most important role required of an electrostatic chuck used in a semiconductor manufacturing apparatus is to efficiently dissipate processing heat generated during wafer processing to the coolant, thereby cooling the wafer below a desired temperature and uniformly controlling the temperature within the wafer. In an apparatus for generating a plasma to process a wafer such as a dry etching apparatus, a plasma CVD apparatus, and a plasma ashing apparatus, heat generated by plasma needs to be dissipated. Also in an apparatus without plasma generation such as a sputtering apparatus and an ion implantation apparatus, processing heat generated during wafer processing needs to be dissipated. Furthermore, in semiconductor manufacturing apparatuses, reduction of the throughput, or processing time taken per wafer, is always required. Hence, for each change to a new generation of semiconductor processing apparatuses, the plasma power and the amount of processing heat are increased for reducing the throughput. Thus, in an electrostatic chuck, improvement of cooling efficiency is always required. The invention provides an electrostatic chuck meeting the above requirements at a relatively low manufacturing cost.

In the following, a method for manufacturing a dielectric substrate of the electrostatic chuck of the invention is illustrated separately for a Coulomb type electrostatic chuck and a Johnsen-Rahbek type electrostatic chuck.

An example method for fabricating a dielectric substrate 24 of a Coulomb type electrostatic chuck is as follows. Alumina powder having an average particle size of 0.1 μm and a purity of 99.99% or more is used as a raw material. An acrylic binder is added thereto, adjusted, and then granulated by a spray dryer to prepare granulated powder. Subsequently, after CIP (rubber press) or mechanical press molding, the mold is processed into a predetermined shape, and sintered under an ambient atmosphere at 1250° C. to 1450° C. Then an HIP (hot isostatic pressing) process is performed in Ar gas at 1000 atm or more and at a temperature of 1250° C. to 1450° C., being the same as the sintering temperature. Such condition results in an extremely dense dielectric substrate 24, where the average particle size of the constituent particle is 2 μm or less, the volume resistivity is $10^8$-$10^{11}$ Ωcm or more at 20±3° C., the relative density is 99% or more, and the thermal conductivity is 30 W/mK or more.

An example method for fabricating a dielectric substrate 24 of a Johnsen-Rahbek type electrostatic chuck is as follows. Alumina powder having an average particle size of 0.1 μm and a purity of 99.99% or more is used as a raw material, and ground with titanium oxide ($TiO_2$) in the proportion exceeding 0.2 wt % and being 0.6 wt % or less. An acrylic binder is added thereto, adjusted, and then granulated by a spray dryer to produce granulated powder. Subsequently, after CIP (rubber press) or mechanical press molding, the mold is processed into a predetermined shape, and sintered under a reducing atmosphere at 1150° C. to 1350° C. Then an HIP (hot isostatic pressing) process is performed in Ar gas at 1000 atm or more and at a temperature of 1150° C. to 1350° C., being the same as the sintering temperature. Such condition results in an extremely dense dielectric substrate 24, where the average particle size of the constituent particle is 2 μm or less, the volume resistivity is $10^8$-$10^{11}$ Ωcm or more at 20±3° C., the relative density is 99% or more, and the thermal conductivity is 30 W/mK or more.

The term "average particle size" as used herein refers to a particle size determined by the following planimetric method. First, a photograph of the dielectric substrate is taken by SEM. A circle having a known area A is drawn on the photograph. The number of particles per unit area, $N_G$, is determined by the following formula (I) from the number of particles in the circle, $n_c$, and the number of particles intersecting the perimeter of the circle, $n_i$:

$$N_G = (n_c + (1/2)n_i)/(A/m^2) \qquad (1)$$

where m is the magnification of the photograph. Because $1/N_G$ is the area occupied by one particle, the average particle size can be determined by $2/\sqrt{(\pi N_G)}$, which represents the circle-equivalent diameter.

The invention claimed is:

1. An electrostatic chuck comprising:
    a metal plate with an insulator film formed on a surface thereof by thermal spraying; and
    a dielectric substrate with an electrode formed on a surface thereof,
    the metal plate and the dielectric substrate being bonded together via an insulative adhesive interposed therebetween so that the insulator film is opposed to the electrode, and
    the insulator film having a thickness of 0.6 mm or less.

2. The electrostatic chuck according to claim 1, wherein the insulator film has a thermal conductivity of 2 W/mK or more.

3. The electrostatic chuck according to claim 1, wherein the insulative adhesive has a thermal conductivity of 1 W/mK or more.

4. The electrostatic chuck according to claim 1, wherein the insulative adhesive has a thickness of 0.1 mm or more and 0.3 mm or less.

5. The electrostatic chuck according to claim 1, wherein the insulator film has a higher thermal conductivity than the insulative adhesive.

6. The electrostatic chuck according to claim 1, wherein the insulative adhesive has a flexibility of 30% or more in elongation percentage.

7. The electrostatic chuck according to claim 1, wherein the insulative adhesive is a single adhesive compound provided over one entire face of the insulator film.

8. An electrostatic chuck comprising:
    a metal plate with an insulator film formed on a surface thereof by thermal spraying; and
    a dielectric substrate with an electrode selectively formed on a surface thereof,
    the metal plate and the dielectric substrate being bonded together via an insulative adhesive interposed therebetween so that the insulator film is opposed to the electrode,
    the insulative adhesive being interposed also between the insulator film and a portion of the surface of the dielectric substrate where the electrode is not formed, and
    a thermal conductivity of the insulator film is higher than a thermal conductivity of the insulative adhesive.

9. The electrostatic chuck according to claim 8, wherein the dielectric substrate has a relative density of 99% or more and a thermal conductivity of 30 W/mK or more.

10. The electrostatic chuck according to claim 8, wherein the insulative adhesive has a flexibility of 30% or more in elongation percentage.

11. The electrostatic chuck according to claim 8, wherein the insulator film has a thickness of 0.6 mm or less.

12. The electrostatic chuck according to claim 8, wherein the insulative adhesive has a thickness of 0.1 mm or more and 0.3 mm or less.

13. The electrostatic chuck according to claim 8, wherein the insulator film has a thermal conductivity of 2 W/mK or more.

14. The electrostatic chuck according to claim 8, wherein the insulative adhesive is a single adhesive compound provided over one entire face of the insulator film.

15. A method for manufacturing an electrostatic chuck, comprising bonding a metal plate to a dielectric substrate via an insulative adhesive interposed therebetween,
    an insulator film being formed by thermal spraying on a surface the metal plate,
    an electrode being formed on a surface of the dielectric substrate, and the bonding being performed so that the insulator film is opposed to the electrode, wherein a thermal conductivity of the insulator film is higher than a thermal conductivity of the insulative adhesive.

16. The method for manufacturing an electrostatic chuck according to claim 15, wherein the electrode is selectively formed on the surface of the dielectric substrate.

17. The method for manufacturing an electrostatic chuck according to claim 16, wherein the insulative adhesive is interposed also between the insulator film and a portion of the surface of the dielectric substrate where the electrode is not formed.

18. The method for manufacturing an electrostatic chuck according to claim 15, wherein the insulative adhesive has a thermal conductivity of 1 W/mK or more.

19. The method for manufacturing an electrostatic chuck according to claim 15, wherein the dielectric substrate has a relative density of 99% or more and a thermal conductivity of 30 W/mK or more.

20. The method for manufacturing an electrostatic chuck according to claim 15, wherein the insulator film has a thickness of 0.6 mm or less.

21. The method for manufacturing an electrostatic chuck according to claim 15, wherein the insulative adhesive has a thickness of 0.1 mm or more and 0.3 mm or less.

22. The method for manufacturing an electrostatic chuck according to claim 15, wherein the insulator film has a thermal conductivity of 2 W/mK or more.

23. The method for manufacturing an electrostatic chuck according to claim 15, wherein the insulative adhesive is a single adhesive compound provided over one entire face of the insulator film.

* * * * *

UNITED STATES PATENT AND TRADEMARK OFFICE
CERTIFICATE OF CORRECTION

| | | |
|---|---|---|
| PATENT NO. | : 7,672,111 B2 | Page 1 of 1 |
| APPLICATION NO. | : 11/998463 | |
| DATED | : March 2, 2010 | |
| INVENTOR(S) | : Miyaji et al. | |

It is certified that error appears in the above-identified patent and that said Letters Patent is hereby corrected as shown below:

Title page:
    After "*Primary Examiner—*" change "Ronald W Leja" to --Ronald W. Leja--.
    In item (57), the ABSTRACT, 5th line, change "interposed ther-" to --interposed there- --;
        6th line, change "ebetween" to --between--.

Column 2:
    Line 36, change "surface the metal" to --surface of the metal--.

Column 4:
    Lines 12-13, change "insulation withstand voltage" to --insulating material to withstand--.
    Line 17, change "Coulomb type" to --Coulomb-type--.
    Line 19, change "Johnsen-Rahbek type" to --Johnsen-Rahbek-type--.
    Line 20, change "Coulomb type" to --Coulomb-type--.
    Line 27, change "Johnsen-Rahbek type" to --Johnsen-Rahbek-type--.

Column 5:
    Line 15, change "Coulomb type" to --Coulomb-type--.
    Line 16, change "Johnsen-Rahbek type" to --Johnsen-Rahbek-type--.
    Line 18, change "Coulomb type" to --Coulomb-type--.
    Line 31, change "$10^8$-$10^{11}$" to --$10^{14}$--.
    Line 35, change "Johnsen-Rahbek type" to --Johnsen-Rahbek-type--.

Column 6:
    Line 65, change "surface the metal" to --surface of the metal--.

Signed and Sealed this

Sixth Day of July, 2010

David J. Kappos
*Director of the United States Patent and Trademark Office*